(12) United States Patent
Whig et al.

(10) Patent No.: US 12,477,955 B2
(45) Date of Patent: Nov. 18, 2025

(54) MAGNETORESISTIVE STACK AND METHODS THEREFOR

(71) Applicant: Everspin Technologies, Inc., Chandler, AZ (US)

(72) Inventors: Renu Whig, Chandler, AZ (US); Sumio Ikegawa, Phoenix, AZ (US); Jon Slaughter, Slingerlands, NY (US); Michael Tran, San Jose, CA (US); Jacob Wang Chenchen, Singapore (SG); Ganesh Kolliyil Rajan, Singapore (SG)

(73) Assignee: Everspin Technologies, Inc., Chandler, AZ (US)

( * ) Notice: Subject to any disclaimer, the term of this patent is extended or adjusted under 35 U.S.C. 154(b) by 695 days.

(21) Appl. No.: 17/263,434

(22) PCT Filed: Jul. 29, 2019

(86) PCT No.: PCT/US2019/043914
§ 371 (c)(1),
(2) Date: Jan. 26, 2021

(87) PCT Pub. No.: WO2020/028250
PCT Pub. Date: Feb. 6, 2020

(65) Prior Publication Data
US 2021/0288245 A1    Sep. 16, 2021

Related U.S. Application Data

(60) Provisional application No. 62/711,918, filed on Jul. 30, 2018.

(51) Int. Cl.
*H10N 50/85*    (2023.01)
*H01F 10/32*    (2006.01)
(Continued)

(52) U.S. Cl.
CPC ......... *H10N 50/85* (2023.02); *H01F 10/3259* (2013.01); *H01F 10/3272* (2013.01);
(Continued)

(58) Field of Classification Search
CPC ......... H10N 50/85; H10N 50/80; H10N 50/10
See application file for complete search history.

(56) References Cited

U.S. PATENT DOCUMENTS 8,686,484 B2    4/2014    Whig et al.
8,747,680 B1    6/2014    Deshpande et al.
(Continued)

FOREIGN PATENT DOCUMENTS

CN    104395964 A    3/2015
CN    108028315 A    5/2018
(Continued)

OTHER PUBLICATIONS

International Search Report and Written Opinion issued Oct. 25, 2019 in International Application No. PCT/US2019/043914 (16 pages).
(Continued)

*Primary Examiner* — Michele Fan
(74) *Attorney, Agent, or Firm* — Bookoff McAndrews PLLC

(57) ABSTRACT

A magnetoresistive device includes a magnetically fixed region and a magnetically free region positioned on opposite sides of a tunnel barrier region. One or more transition regions, including at least a first transition region and second transition region, is positioned between the magnetically fixed region and the tunnel barrier region. The first transition region includes a non-ferromagnetic transition metal and the second transition region includes an alloy including iron and boron.

13 Claims, 7 Drawing Sheets

(51) Int. Cl.
  *H10N 50/01* (2023.01)
  *H10B 61/00* (2023.01)
  *H10N 50/10* (2023.01)
(52) U.S. Cl.
  CPC ......... *H01F 10/3286* (2013.01); *H10N 50/01* (2023.02); *H01F 10/329* (2013.01); *H10B 61/22* (2023.02); *H10N 50/10* (2023.02)

(56) References Cited

U.S. PATENT DOCUMENTS

| | | | |
|---|---|---|---|
| 9,023,216 | B2 | 5/2015 | Kochergin et al. |
| 9,136,464 | B1 | 9/2015 | Whig et al. |
| 9,419,208 | B2 | 8/2016 | Whig et al. |
| 2012/0068285 | A1 | 3/2012 | Kitagawa et al. |
| 2014/0103469 | A1 | 4/2014 | Jan et al. |
| 2015/0129996 | A1 | 5/2015 | Tang et al. |
| 2016/0284763 | A1 | 9/2016 | Tahmasebi et al. |
| 2017/0025602 | A1* | 1/2017 | Liu .............. H01F 10/3286 |
| 2018/0158498 | A1 | 6/2018 | Aggarwal et al. |
| 2019/0131519 | A1 | 5/2019 | Ikegawa et al. |
| 2019/0140167 | A1 | 5/2019 | Aggarwal et al. |
| 2019/0157549 | A1* | 5/2019 | Sun .............. H10N 50/10 |
| 2019/0165253 | A1 | 5/2019 | Sun et al. |
| 2019/0173004 | A1 | 6/2019 | Deshpande et al. |

FOREIGN PATENT DOCUMENTS

| | | |
|---|---|---|
| JP | 2012502447 A | 1/2012 |
| WO | 2018/063338 A1 | 4/2018 |
| WO | 2019090060 A2 | 5/2019 |

OTHER PUBLICATIONS

Yakushiji et al. "Ultralow-Voltage Spin-Transfer Switching in Perpendicularly Magnetized Magnetic Tunnel Junctions with Synthetic Antiferromagnetic Reference Layer", Applied Physics Express, vol. 6, 113006, Nov. 1, 2013.

Yakushiji et al. "Perpendicular magnetic tunnel junctions with strong antiferromagnetic interlayer exchange coupling at first oscillation peak", Applied Physics Express, vol. 8, 083003, Jul. 22, 2015.

Chinese Office Action issued on Sep. 12, 2023 in counterpart Chinese Patent Application No. 201980050633.4 (9 pages, in English).

Partial Extended European Search Report issued for European Application No. 24168941.3, mailed Aug. 7, 2024 (14 pages).

Extended European Search Report issued for European Application No. 24168941.3, dated Oct. 29, 2024, pp. 1-12.

* cited by examiner

MAGNETORESISTIVE STACK AND METHODS THEREFOR

CROSS-REFERENCE TO RELATED APPLICATIONS

This application is the U.S. National Phase Entry under 35 U.S.C. § 371 of International Application No. PCT/US2019/043914, filed on Jul. 29, 2019. The International Application No. PCT/US2019/043914 claims priority to U.S. Provisional Application No. 62/711,918, filed on Jul. 30, 2018, which is incorporated by reference herein in its entirety.

TECHNICAL FIELD

The present disclosure relates to, among other things, magnetoresistive stacks and methods for fabricating and using the disclosed magnetoresistive stacks.

INTRODUCTION

There are many inventions described and illustrated herein, as well as many aspects and embodiments of those inventions. In one aspect, the present disclosure relates to a magnetoresistive stack (for example, part of a magnetoresistive memory device, magnetoresistive sensor/transducer device, etc.) and methods of manufacturing the described magnetoresistive stacks. Exemplary magnetoresistive stacks (for example, used in a magnetic tunnel junction (MTJ) magnetoresistive device) of the present disclosure include two transition regions-one formed of tantalum (Ta) and one formed of an iron boron alloy (FeB) having a concentration of at least 50 at. % of boron. In some embodiments, the two transition regions may be referred to as a single bi-layer transition region.

Briefly, a magnetoresistive stack used in a memory device (e.g., a magnetoresistive random access memory (MRAM)) includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information may be stored in the magnetoresistive memory stack by switching, programming, and/or controlling the direction of magnetization vectors in the magnetic layer(s) of the "free" magnetic region. The direction of the magnetization vectors of the "free" magnetic region may be switched and/or programmed (for example, through spin-transfer torque (STT)) by application of a write signal (e.g., one or more current pulses) to (e.g., through) the magnetoresistive memory stack. In contrast, the magnetization vectors in the magnetic layers of a "fixed" magnetic region are magnetically fixed in a predetermined direction. When the magnetization vectors of the "free" magnetic region adjacent to the non-magnetic layer are in the same direction as the magnetization vectors of the "fixed" magnetic region adjacent to the non-magnetic layer, the magnetoresistive memory stack has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack has a second magnetic state. The magnetic state of the magnetoresistive memory stack is determined or read based on the resistance of the stack in response to a read current (IR).

It should be noted that, although exemplary embodiments are described and/or illustrated herein in the context of MTJ stacks/structures, the present inventions may also be implemented in giant magnetoresistive (GMR) stacks/structures where a conductor (e.g., copper) is disposed between two ferromagnetic regions/layers/materials. Indeed, the present inventions may be employed in connection with other types of magnetoresistive stacks/structures wherein such stacks/structures include a fixed magnetic region. For the sake of brevity, the discussions and illustrations will not be repeated specifically in the context of GMR or other magnetoresistive stacks/structures—but such discussions and illustrations are to be interpreted as being entirely applicable to GMR and other stacks/structures.

Embodiments of the present disclosure may be drawn to MTJ stacks having multiple transition regions in order to improve the quality of the tunnel barrier that is formed on top of the transition regions. By including multiple transition regions, each with specific contents, MTJ stacks of the present disclosure may achieve a lower switching voltage, which may improve endurance performance. Thus, MTJ stacks of the present disclosure may have improved breakdown distributions, improved cycling endurance, decreased switching voltage, and/or improved MRAM performance. The disclosed magnetoresistive stacks may have some or all of these desired characteristics. The scope of the current disclosure, however, is defined by the attached claims, and not by any characteristics of the resulting device or method.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate the embodiment(s) is/are "example" embodiment(s). Further, even though the figures and this written disclosure appear to describe the disclosed magnetoresistive stacks in a particular order of construction (e.g., from bottom to top), it is understood that the depicted magnetoresistive stacks may have a different order (e.g., the opposite order (i.e., from top to bottom)). For example, a "fixed" magnetic region may be formed on or above a "free" magnetic region or layer, which in turn may be formed on or above an insertion layer of the present disclosure.

Figure 1:
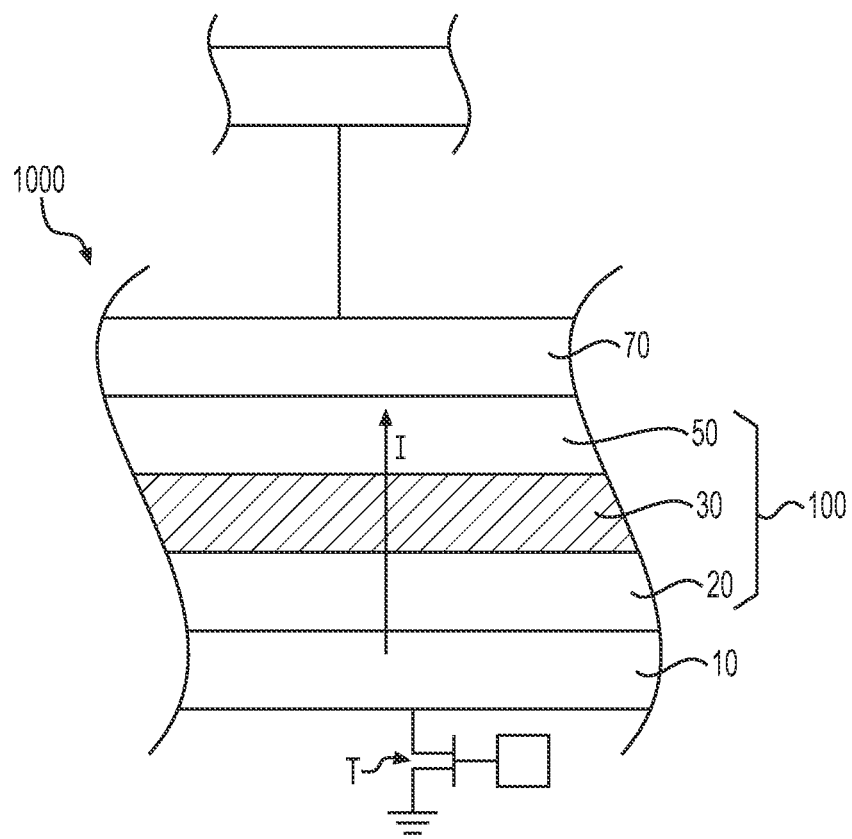
Figure 2:
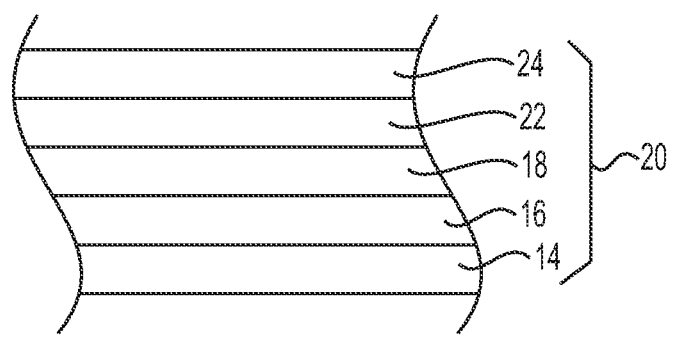
Figure 3:
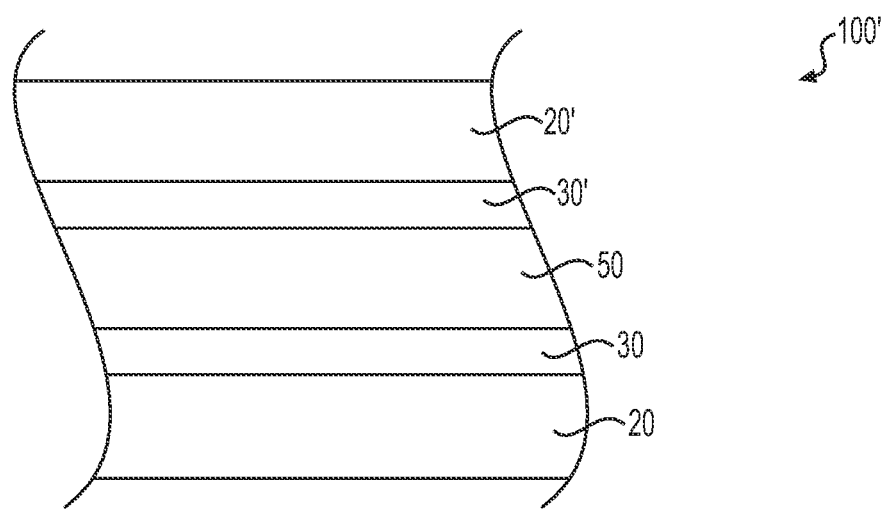
Figure 4:
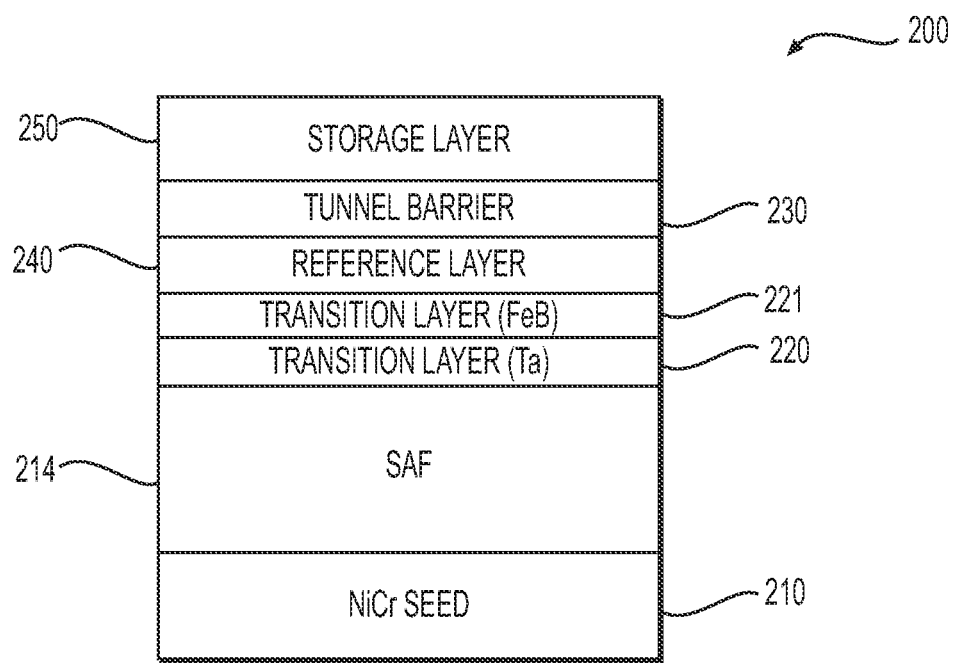
Figure 5A:
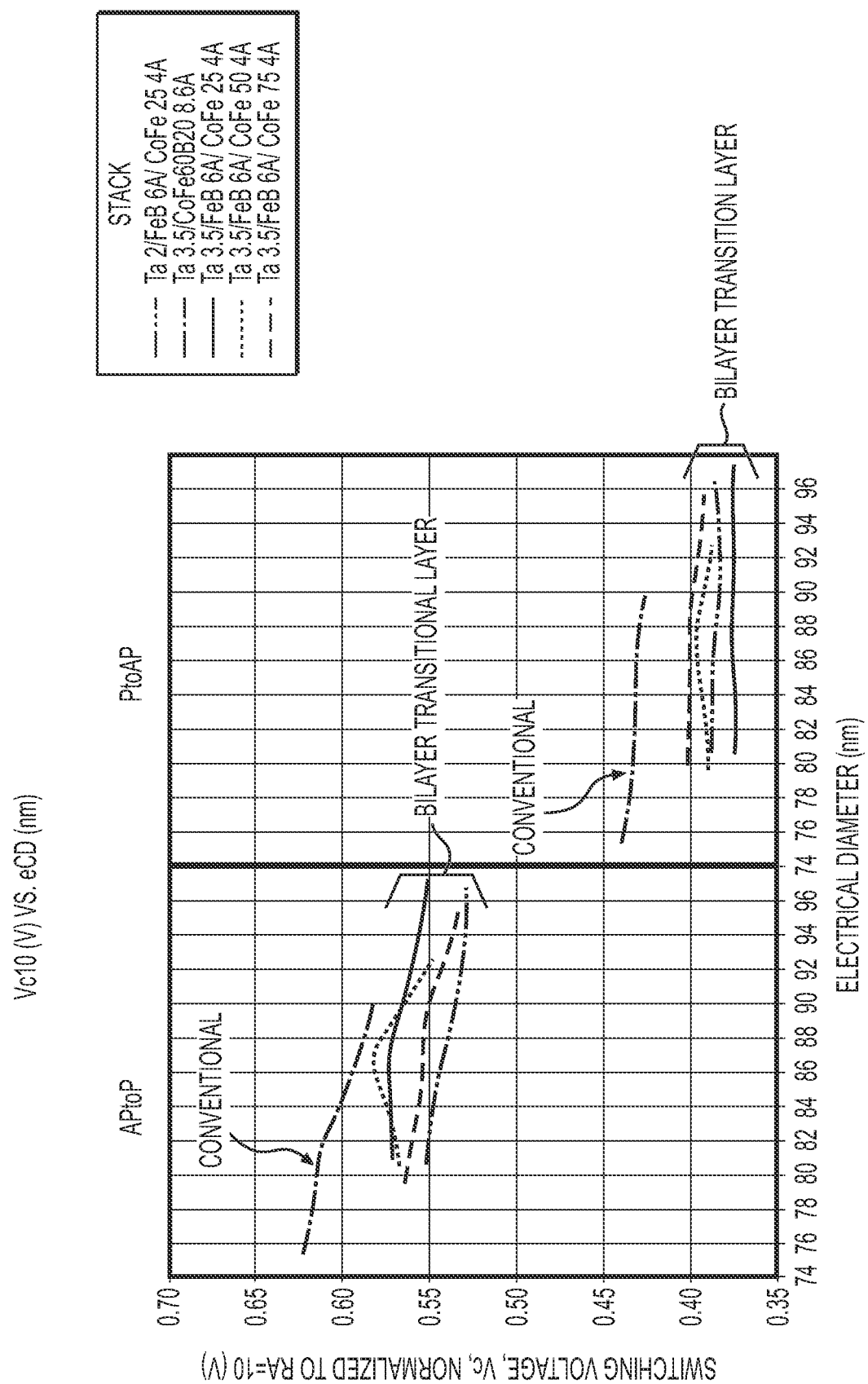
Figure 5B:
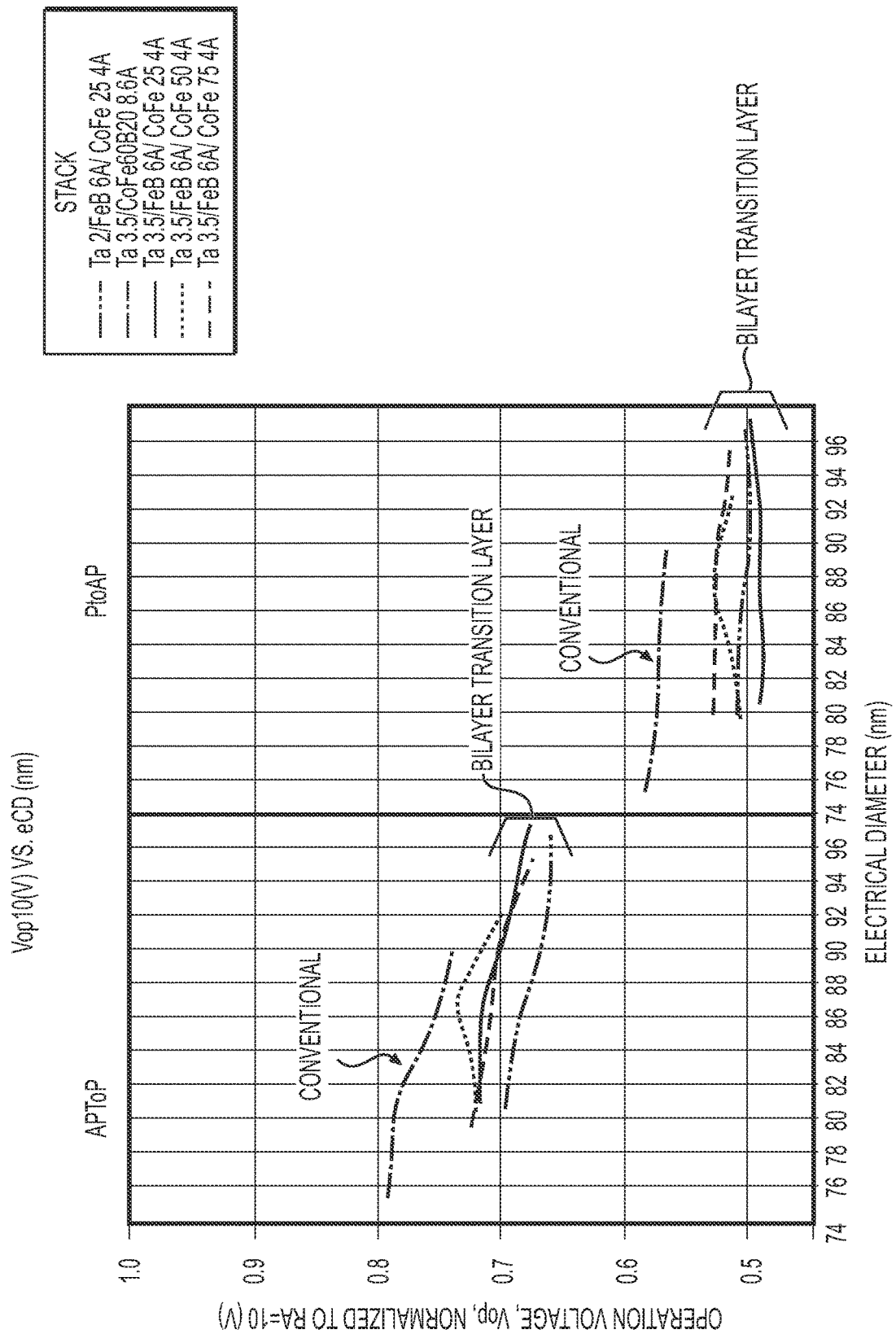
Figure 6:
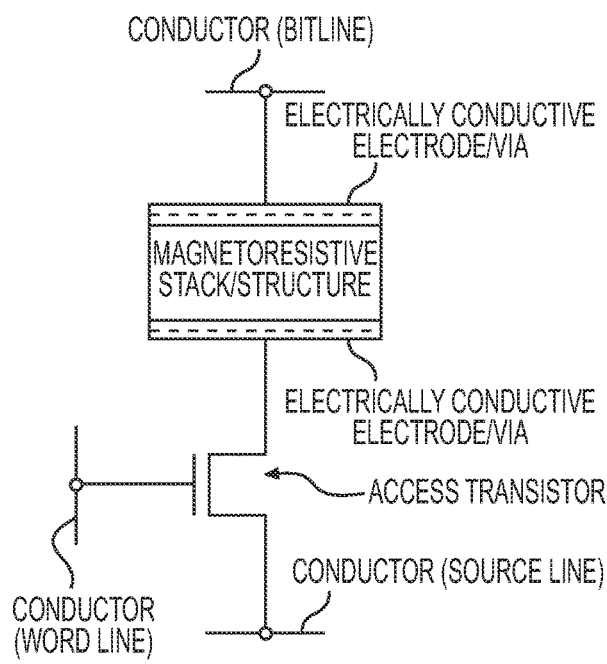
Figure 7A:
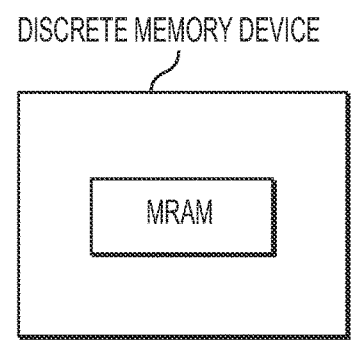
Figure 7B:
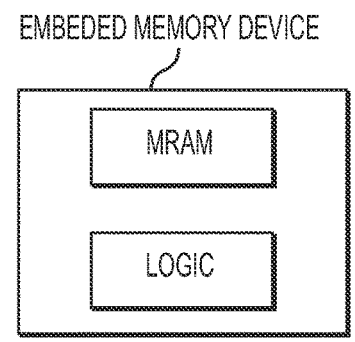
Figure 8:
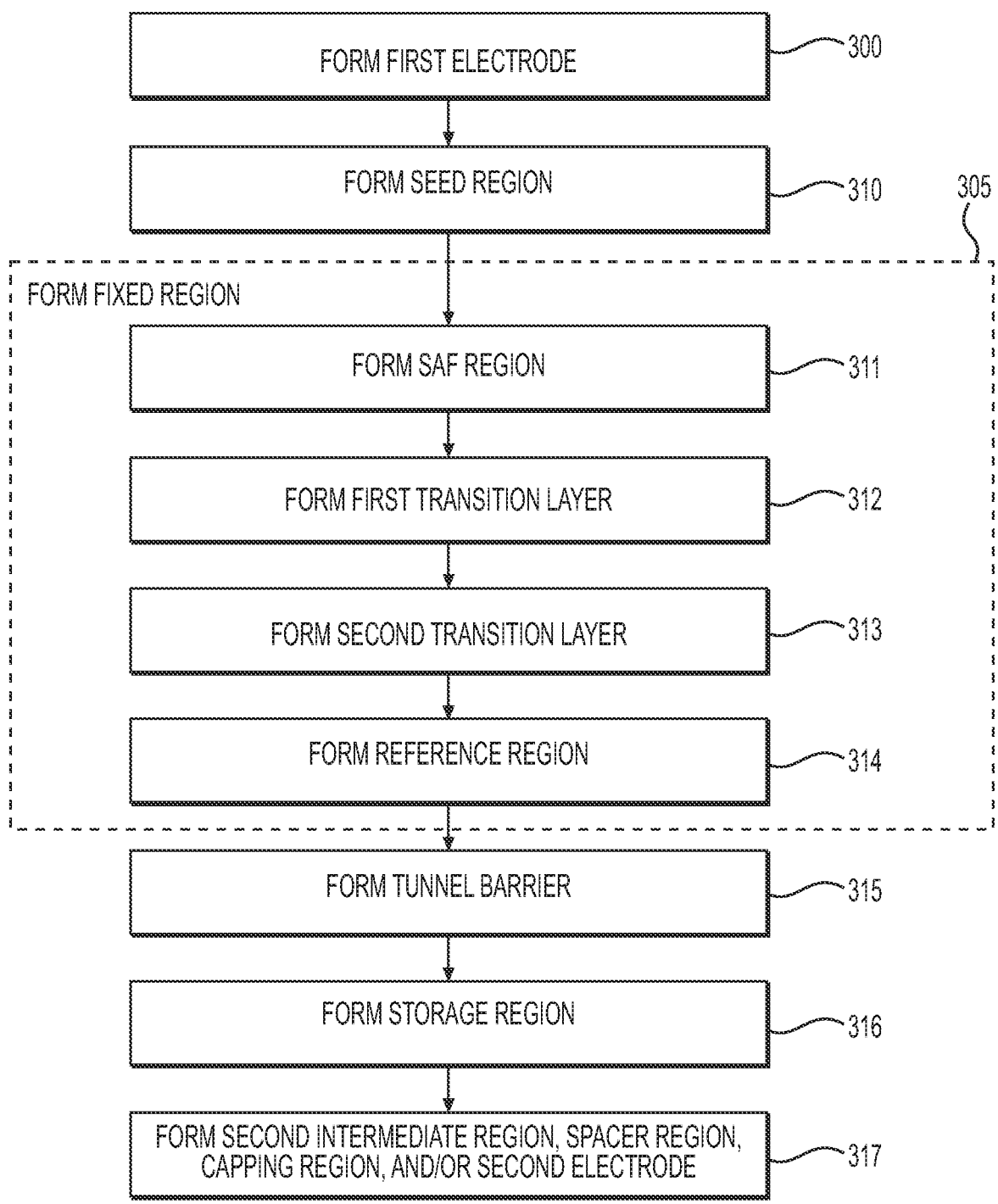

FIG. 1 is a cross-sectional view depicting various regions of an exemplary magnetoresistive cell of an exemplary magnetoresistive device in one embodiment;

FIG. 2 is a cross-sectional view of an exemplary fixed region of the exemplary magnetoresistive cell of FIG. 1;

FIG. 3 is a cross-sectional view of an exemplary magnetoresistive cell of an exemplary magnetoresistive device in an exemplary embodiment;

FIG. 4 is a cross-sectional view of an exemplary magnetoresistive cell of an exemplary magnetoresistive device in an exemplary embodiment;

FIG. 5A graphically compares the switching voltage of a conventional magnetoresistive cell with the switching voltages of magnetoresistive cells having bilayer transition regions, according to exemplary embodiments of the present disclosure;

FIG. 5B graphically compares the operation voltage of a conventional magnetoresistive cell with the operation voltages of magnetoresistive cells having bilayer transition regions, according to exemplary embodiments of the present disclosure;

FIG. 6 is a schematic diagram of an exemplary magnetoresistive memory stack electrically connected to an access transistor in a magnetoresistive memory cell configuration; and FIGS. 7A and 7B are schematic block diagrams of integrated circuits including a discrete memory device and an embedded memory device, each including an MRAM (which, in one embodiment is representative of one or more arrays of MRAM having a plurality of magnetoresistive memory stacks according to aspects of certain embodiments of the present disclosure); and FIG. 8 is a simplified exemplary manufacturing flow for the formation (e.g., via deposition) of layers of the exemplary MTJ-type magnetoresistive stack/structures described herein, according to at least certain aspects of certain embodiments of the present disclosure, wherein the various layers and/or regions are sequentially deposited, grown, sputtered, evaporated, and/or provided (used herein collectively as "deposited" or other verb tense (e.g., "deposit" or "depositing")) to provide the material stack that, after further processing, is an MTJ-type magnetoresistive stack/structure.

It should be noted that, although individual regions of FIGS. 1-4 are illustrated as distinct layers with sharp, well-defined boundaries, typically, the materials of two adjacent layers at an interface (between the layers) may diffuse into each other, and present an interfacial region of an alloy or a combination of the materials of the two individual layers. Further, while all of the layers or regions of these figures may be present and distinguishable immediately after formation of these regions, in some embodiments, it may be difficult to distinguish some of these regions in a cross-section. In some embodiments, some of these layers may appear as an interfacial region having a higher concentration of an element or a material.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of 10% (unless a different variation is specified) from the disclosed numeric value. For example, a layer disclosed as being "t" units thick can vary in thickness from (t−0.1 t) to (t+0.1 t) units. Further, all relative terms such as "about," "substantially," "approximately," etc. are used to indicate a possible variation of 10% (unless noted otherwise or another variation is specified). Moreover, in the claims, values, limits, and/or ranges of the thickness and atomic composition of, for example, the described layers/regions, mean the value, limit, and/or range±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by inter-layer diffusion, etc.) after further processing (e.g., exposure to high temperatures, etc.).

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive stacks are referred to by specific names (capping region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the "free" region is depicted as being "above" an intermediate region, in some aspects the entire magnetoresistive stack may be flipped such that the intermediate region is "above" the "free" region.

In one exemplary aspect, the magnetoresistive stack of the present disclosure may be implemented as a spin-torque magnetoresistive random access memory ("MRAM") element ("memory element"). In such aspects, the magnetoresistive stack may include an intermediate region positioned (or sandwiched) between two ferromagnetic regions to form a magnetic tunnel junction (MTJ) device or an MTJ-type device. The intermediate region may be a tunnel barrier and include an insulating material, such as, e.g., a dielectric material. In other embodiments, the intermediate region may be a conductive material, e.g., copper, gold, or alloys thereof. In these other embodiments, where the magnetoresistive stack includes a conductive material in between two ferromagnetic regions, the magnetoresistive stack may form a giant magnetoresistance (GMR) or GMR-type device.

Of the two ferromagnetic regions disposed on either side of the intermediate region, one ferromagnetic region may be a magnetically "fixed" (or pinned) region, and the other ferromagnetic region may be a magnetically "free" region. The term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector does not move substantially in response to such applied magnetic fields or spin-polarized currents. As is known in the art, an electrical resistance of the described magnetoresistive stack may change based on whether the magnetization direction (e.g., the direction of the magnetic moment) of the "free" region adjacent to the non-magnetic layer is in a parallel alignment or in an antiparallel alignment with the magnetization direction (e.g., the direction of the magnetic moment) of the "fixed" region adjacent to the non-magnetic layer. Typically, if the two regions have the same magnetization alignment, the resulting relatively low(er) resistance is considered as a digital "0," while if the alignment is antiparallel the resulting relatively high(er) resistance is considered to be a digital "1." A memory device (such as an MRAM) may include multiple such magnetoresistive stacks, which may be referred to as memory cells or elements, arranged in an array of columns and rows. By measuring the current through each cell, the resistance of each cell, and thus the data stored in the memory array can be read.

Switching the magnetization direction of the "free" region of a magnetoresistive stack may be accomplished by driving a tunneling current pulse through the magnetoresistive stack. The polarity of the current pulse determines the final magnetization state (i.e., parallel or antiparallel) of the "free" region. For example, directing tunneling current of sufficient magnitude in one direction (e.g., from the "fixed" region towards the "free" region) may change the magnetization state of the "free" region to be antiparallel (i.e., AP) with the magnetization state of the "fixed" region. And, directing the tunneling current in the opposite direction (e.g., from the "free" region towards the "fixed" region) may change the magnetization state of the "free" region to be parallel (i.e., P) with the magnetization state of the "fixed" region. The mean current required to switch the magnetic state of the "free" region may be referred to as the critical current (Ic). The critical current is indicative of the current required to "write" data in (or the write current of) a magnetoresistive memory cell. As those of ordinary skill in the art will recognize, the write current may be larger than the critical current. For example, in some cases, the write current may be 1.4 to 1.6 times larger than the critical current. Reducing the required write current(s) is desirable so that, among other things, a smaller access transistor can be used for each memory cell and a higher density, lower cost memory can be produced. Reduced write current requirements may also lead to greater longevity of an MTJ-type magnetoresistive memory cell due to, e.g., reduce degradation of the intermediate dielectric layer.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers or regions (i.e., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer (or material) not protected by the remaining resist is patterned. Alternatively, an additive process can be used in which a structure is built up using the photoresist as a template.

As alluded to above, in one aspect, the described embodiments relate to, among other things, methods of manufacturing a magnetoresistive stack having one or more electrically conductive electrodes, vias, or conductors on either side of a magnetic material stack. As described in further detail below, the magnetic material stack may include many different regions of material, where some of these regions include magnetic materials, whereas others do not. In one embodiment, the methods of manufacturing include sequentially depositing, growing, sputtering, evaporating, and/or providing (as noted above, herein collectively "depositing" or other verb tense (e.g., "deposit" or "deposited")) regions which, after further processing (for example, etching) form a magnetoresistive stack.

The disclosed magnetoresistive stacks may be formed between a top electrode/via/line and a bottom electrode/via/line and, which permit access to the stack by allowing for connectivity (for example, electrical) to circuitry and other elements of the magnetoresistive device (e.g., access transistors, bit line, word line, logic circuitry, etc.). Between the electrodes/vias/lines are multiple regions (i.e., regions made of one or more layers), including at least one "fixed" magnetic region (referred to hereinafter as a "fixed" region) and at least one "free" magnetic region (referred to hereinafter as a "free" region) with one or more intermediate region(s), such as, e.g., a dielectric layer (that form(s) a tunnel barrier) between the "fixed" and "free" magnetic regions. Each of the "fixed" and "free" magnetic regions may include, among other things, a plurality of ferromagnetic layers. In some embodiments, the top electrode (and/or the bottom electrode) may be eliminated, and a bit line (or an interconnect in electrical contact with the bit line) may be formed on top of the stack. Similarly, in some embodiments, the bottom electrode may be eliminated and the MTJ bit may be formed directly on a word line (or an interconnect structure in electrical contact with the word line) of the device.

FIG. 1 is a cross-sectional view of a portion of an exemplary MTJ device 1000 illustrating an exemplary MTJ bit 100 of MTJ device 1000. MTJ bit 100 may be coupled or otherwise connected to an access transistor T (or other suitable select devices, such as, e.g., a diode) and to various conductors (e.g., source line conductor, word line conductor, bit line conductor, etc.) which may carry one or more control signals and provide access to MTJ bit 100 (e.g., to read and write MTJ bit 100 as will be described later). MTJ device 1000 may be used in any suitable application, including, e.g., in a memory configuration.

As illustrated in FIG. 1, MTJ bit 100 includes an intermediate region 30 (which in an MTJ device includes a dielectric material and functions as a tunnel barrier) positioned between a fixed region 20 and a free region 50. In some embodiments, as illustrated in FIG. 1, MTJ bit 100 may be formed between a first electrode 10 (e.g., a bottom electrode) and a second electrode 70 (e.g., a top electrode). First and second electrodes 10, 70 may comprise an electrically conductive material, and may be part of (or be in physical contact with) electrically conductive interconnects (e.g., vias, traces, lines, etc.) of MTJ device 1000. Although any electrically conductive material may be used for first and second electrodes 10, 70, in some embodiments, a metal such as tantalum (Ta), titanium (Ti), tungsten (W), or a composite or alloy of these elements (e.g., tantalum-nitride alloy) may be used. In some embodiments, first and/or second electrodes 10, 70 may be eliminated, and MTJ bit 100 may be in direct contact with a metallization structure (e.g., line, via, etc.) of MTJ device 1000. Although not illustrated in FIG. 1, in some embodiments, first electrode 10 may include a seed layer at its interface with the overlying region (e.g., fixed region 20). During fabrication, the seed layer may assist in the formation of the overlying region on electrode 10. The seed layer may include one or more of nickel (Ni), chromium (Cr), cobalt (Co), iron (Fe), ruthenium (Ru), platinum (Pt), tantalum (Ta), and alloys thereof (for example, an alloy including nickel (Ni) and/or chromium (Cr)). In some embodiments, the seed layer may be eliminated, and the top surface of electrode 10 itself may act as the seed layer.

With continuing reference to FIG. 1, fixed region 20 may be formed on (or above) first electrode 10. It should be noted that the structure of fixed region 20 illustrated in FIG. 1 is only exemplary. Fixed region 20 may include alloys that include cobalt (Co) and iron (Fe) and other materials (preferably cobalt (Co), iron (Fe), and boron (B)). Typically, the composition of materials (e.g., cobalt (Co), iron (Fe), and boron (B)) in fixed region 20 may be selected to achieve good temperature compensation. The configuration of fixed region 20 shown in FIG. 1 is only exemplary, and as known to those of ordinary skill in the art, many other configurations are possible. In general, fixed region 20 may include a single layer or multiple layers stacked one on top of another. In some embodiments, fixed region 20 also may include one or more non-magnetic material layers. For example, ruthenium (Ru), rhodium (Rh), platinum (Pt), palladium (Pd), rhenium (Re), iridium (Ir), copper (Cu), aluminum (Al), tantalum (Ta), titanium (Ti), niobium (Nb), vanadium (V), zirconium (Zr), one or more alloys of these elements, and in certain embodiments, tungsten (W) and molybdenum (Mo). In some embodiments, fixed region 20 may include a multi-layer structure of cobalt (Co) and platinum (Pt), cobalt (Co) and palladium (Pd), or cobalt (Co) and nickel (Ni) (with or without other alloying elements).

FIG. 2 illustrates an exemplary embodiment of fixed region 20. Fixed region 20 may be a fixed, unpinned synthetic antiferromagnetic (SAF) region disposed on or above electrode 10. The fixed, unpinned SAF region may include at least two magnetic regions 14, 18 (e.g., ferromagnetic layer 1 and ferromagnetic layer 2) separated by a coupling region 16. Ferromagnetic regions 14, 18 may include one or more of the ferromagnetic elements nickel (Ni), iron (Fe), and cobalt (Co), including alloys or engineered materials with one or more of the elements palladium (Pd), platinum (Pt), nickel (Ni), and alloys thereof, and the coupling region 16 may be an antiferromagnetic (AF) coupling region that includes non-ferromagnetic materials such as, for example, iridium (Ir), ruthenium (Ru), rhenium (Re), or rhodium (Rh). In some embodiments, one or both of ferromagnetic regions 14, 18 may comprise a magnetic multi-layer structure that includes a plurality of layers of a first ferromagnetic material (e.g., cobalt (Co)) and a second ferromagnetic material (e.g., nickel (Ni)) or a paramagnetic material (e.g., platinum (Pt)). In some embodiments, ferromagnetic regions 14, 18 may also include, for example, alloys or engineered materials with one or more of palladium (Pd), platinum (Pt), magnesium (Mg), manganese (Mn), and chromium (Cr). Additionally, or alternatively, in some embodiments, fixed region 20 may include one or more synthetic ferromagnetic structures (SyF). Since SyFs are known to those skilled in the art, they are not described in greater detail herein. In some embodiments, fixed region 20 may have a thickness in the range of approximately 8 Å and approximately 300 Å, approximately 15 Å and approximately 110 Å, greater than or equal to 8 Å, greater than or equal to 15 Å, less than or equal to 300 Å, or less than or equal to 110 Å.

In some embodiments, as shown in FIG. 2, fixed region 20 may also include one or more additional layers, such as, for example, a transition region 22 and a reference region 24 disposed at the interface between fixed region 20 and the overlying region (e.g., region 30). Transition and/or reference regions 22, 24 may include one or more layers of material that, among other things, facilitate/improve growth of the overlying intermediate region 30 during fabrication. In one embodiment, reference region 24 may comprise one or more (e.g., all) of cobalt (Co), iron (Fe), and boron (B) (for example, in an alloy—such as an amorphous alloy (e.g., CoFeB or CoFeBTa or CoFeTa)). And, transition region 22 may include a non-ferromagnetic transition metal such as tantalum (Ta), titanium (Ti), tungsten (W), ruthenium (Ru), niobium (Nb), zirconium (Zr), and/or molybdenum (Mo). In general, transition region 22 and reference region 24 may have any thickness. In some embodiments, a thickness (t) of reference region 24 may be approximately 6-13 Å, preferably approximately 8-12 Å, and more preferably approximately 9-9.5 Å, and the thickness of transition region 22 may be approximately 1-8 Å, preferably approximately 1.5-5 Å, and more preferably approximately 2.5-3.5 Å. It should be noted that, in some embodiments, both transition region 22 and reference region 24 may be provided in fixed region 20 of MTJ bit 100. In some embodiments, reference region 24 may be eliminated.

It should be noted that although FIG. 2 (and FIG. 1) shows the different regions of the stack as distinct layers, this is only a simplification. For example, although the different regions of the fixed region of FIG. 2 (and the MTJ bit 100 of FIG. 1) may be sequentially and individually formed (e.g., deposited, deposited, and oxidized, etc.) during fabrication, as would be recognized by those of ordinary skill in the art, the materials that make up the various regions may alloy with (e.g., intermix with, diffuse into, etc.) the materials of adjacent regions during subsequent processing (e.g., high temperature processing operations, such as, annealing, etc.). Therefore, a person skilled in the art would recognize that, although the different regions of fixed region 20 of FIG. 2 (and of MTJ device 100 of FIG. 1) may appear as separate regions with distinct interfaces immediately after formation of these regions, after subsequent processing operations, the materials of the different regions may alloy together to form a single alloyed fixed region 20 having a higher concentration of different materials at interfaces between different regions. Thus, in some cases, it may be difficult to distinguish the different regions of the fixed region 20 (and other regions) in a finished MTJ bit 100 and MTJ device 1000.

With renewed reference to FIG. 1, a free region 50, or storage region, may be provided "above" fixed region 20 with an intermediate region 30 formed between fixed and free regions 20, 50. The relative orientation of fixed and free regions 20, 50 depicted in FIG. 1 is only exemplary. Those of ordinary skill will readily recognize that free region 50 may also be provided below fixed region 20 in the illustration of FIG. 1. As explained previously, the type of intermediate region 30 formed depends upon the type of device being fabricated. In a magnetic tunnel junction bit, intermediate region 30 may include a dielectric material that functions as a tunnel barrier of MTJ bit 100. Intermediate region 30 may be formed on (or above) a surface of fixed region 20, and free region 50 may be formed on (or above) a surface of intermediate region 30. In general, intermediate region 30 may be formed on or above fixed region 20 using any technique now known (e.g., deposition, sputtering, evaporation, etc.) or later developed. In some embodiments, intermediate region 30 may include an oxide material, such as, for example, Magnesium Oxide ($MgO_x$) or Aluminum Oxide ($AlO_x$ (e.g., $Al_2O_3$)), and may be formed by multiple steps of material deposition and oxidation. In general, intermediate region 30 may have any thickness. In some embodiments, intermediate region 30 may have a thickness of approximately 8.5-14.1 Å, preferably approximately 9.6-13.0 Å, and more preferably approximately 9.8-12.5 Å. In some embodiments, intermediate region 30 may have a thickness of approximately 3-14 Å, or approximately 5-12 Å, or approximately 6-10 Å. Although not illustrated in FIG. 1, in some embodiments, a dusting of an interfacial material (e.g., iron (Fe), cobalt-iron-alloy (CoFe) etc.) may also be provided at the interface between free region 50 and intermediate region 30. This interfacial material may result in a high perpendicular magnetic anisotropy (PMA) of the resulting MTJ bit 100.

Free region 50 may include any ferromagnetic alloy. In some embodiments, the ferromagnetic alloy of free region 50 may comprise cobalt (Co), iron (Fe), and boron (B) (referred to as CoFeB). It should be noted that the configuration of free region 50 illustrated in FIG. 1 is only exemplary, and many other configurations are possible. Notwithstanding the specific configuration of free region 50, as explained previously, a magnetic vector (or moment) in free region 50 may be moved or switched by applied magnetic fields or spin-polarized currents.

With renewed reference to FIG. 1, fixed and free regions 20, 50 of MTJ bit 100 may have any suitable configuration (illustrated in FIG. 2 or another suitable configuration). It should also be noted that the configuration/structure of MTJ bit 100 illustrated in FIG. 1 is merely exemplary and not a requirement of the current disclosure. MTJ bit 100 may include, for example, any in-plane or out-of-plane magnetic anisotropy magnetoresistive stack (e.g., a perpendicular magnetic anisotropy magnetoresistive stack).

FIG. 3 illustrates another configuration of an MTJ bit 100' that may be used in MTJ device 1000 of FIG. 1. In MTJ bit 100' of FIG. 3, a free region 50 may be formed between two fixed regions 20, 20' and two intermediate regions 30, 30'. Both fixed regions 20, 20' may have the same structure and/or materials or a different structure and/or materials. For example, one fixed region 20 may have a structure similar to that illustrated in FIG. 2 and the other fixed region 20' may have a structure similar to that shown in FIG. 1 (or another suitable structure). Similarly, both intermediate regions 30, 30' may have the same or different structures, for example, different thickness for different RA (resistancexarea). The structure of MTJ bit 100' of FIG. 3 (where a free region 50 is formed between two fixed regions 20 and 20') is referred to as a dual spin filter (DSF) structure. In a DSF structure of FIG. 3, the ferromagnetic regions next to intermediate regions 30 and 30' in fixed region 20 and 20' have their magnetization orientations aligned in opposite directions. As explained previously, the configuration of the MTJ bits (and the free and fixed regions) described above are merely exemplary. U.S. Pat. Nos. 8,686,484; 8,747,680; 9,023,216; 9,136,464; and 9,419,208, and U.S. patent application Ser. No. 15/831,736 (filed Dec. 5, 2017); 62/591,945 (filed Nov. 29, 2017); 62/594,229 (filed Dec. 4, 2017); 62/580,612 (filed Nov. 2, 2017); 62/582,502 (filed Nov. 7, 2017), and 62/588,158 (filed Nov. 17, 2017) describe exemplary MTJ bits that may also be used in MTJ device 1000 of FIG. 1. These references are incorporated by reference in their entirety herein.

Irrespective of the specific configuration of MTJ bit 100 or 100', as discussed previously, the orientation of the magnetic moment in fixed region 20 is fixed, and the orientation of the magnetic moment in free region 50 may be switched to be parallel (P), or to be antiparallel (AP), to the direction of magnetic moments in fixed region 20. In some MTJ devices, MTJ bit 100 may be switched (from P to AP and vice versa) using magnetic fields generated by current-carrying lines adjacent to MTJ bit 100. However, when MTJ device 1000 is a spin torque transfer (STT) device, MTJ bit 100 is switched by directing a current I (see arrow in FIG. 1) directly through MTJ bit 100. In the DSF structure of MTJ bit 100' in FIG. 3, the orientation of the magnetic moment in free region 50 is always parallel to one of the orientations of the magnetic moment of the two fixed regions 20 and 20' and antiparallel to another. The low resistance state (P state) or high resistance state (AP state) is determined by when the orientation of the magnetic moment of free region 50 is switched to be parallel (P) or to be antiparallel to the direction of one of magnetic moment in fixed regions 20 and 20', which is next to intermediate layer 30 or 30' having high RA (resistance×area) in case of similar MR or high MR in case of similar RA.

The spin-transfer torque (STT) effect is known to those skilled in the art. Briefly, a current (I) becomes spin-polarized after it passes through the first magnetic layer (i.e., fixed region 20 for the direction of current I shown in FIG. 1) in a magnet/non-magnet/magnet tri-layer structure (e.g., fixed region 20/intermediate region 30/free region 50 structure of FIG. 1), where fixed region 20 is substantially fixed in its magnetic orientation by any one of a number of methods known in the art. The direction of the current I represents the opposite direction of the flow of the electrons. The spin-polarized current crosses the nonmagnetic intermediate region 30 and then, through conservation of spin angular momentum, exerts a spin-transfer torque on free region 50. This spin-transfer torque switches the magnetic orientation of free region 50 to be parallel (P) to the magnetic orientation of fixed region 20. If a current of the opposite polarity (e.g., in a direction opposite to the direction of the arrow in FIG. 1) is applied, the current passes first through free region 50 and applies a spin-transfer torque on fixed region 20. However, since the magnetization of fixed region 20 is fixed, its magnetization does not switch. A fraction of the electrons will then reflect off fixed region 20 and travel back across intermediate region 30 and interact with free region 50. In this case, the spin-transfer torque acts to switch the magnetic orientation of free region 50 to be antiparallel (AP) to the magnetic orientation of fixed region 20. Spin-transfer-torque switching occurs only when the magnitude of current I exceeds the critical current Ic of MTJ bit 100. In a typical MTJ device 1000, the spin-transfer-torque switching current I (called write current Iw) used by the circuit is chosen to be somewhat above the average Ic of the multiple MTJ bits 100 in device 1000 so that all MTJ bits 100 will switch reliably when current Iw is applied. During reading of data from MTJ bit 100, a small current (e.g., read current) flows through MTJ bit 100 and the resistance of MTJ bit 100 (e.g., $R_{Min}$, $R_{Max}$, etc.) is detected.

As discussed above in reference to FIGS. 1 and 2, a standard exemplary fixed region 20 of an MTJ bit 100 may include a seed region used to form the fixed region, an SAF region (which may be made up of magnetic regions 14, 18 and coupling region 16), a transition region 22, and a reference region 24. A standard MTJ bit 100 may include a single transition region, which may be formed of a non-ferromagnetic transition metal, such as tantalum (Ta), titanium (Ti), tungsten (W), ruthenium (Ru), niobium (Nb), zirconium (Zr), and/or molybdenum (Mo). Free region 50 (e.g., a storage region) may overlie reference region 24, and intermediate region 30 (e.g., a tunnel barrier) may overlie reference region 24 and be disposed below free region 50.

FIG. 4 depicts an exemplary MTJ bit 200 of the present disclosure, which may include two transition regions in a bilayer arrangement. For example, MTJ bit 200 may include a seed region 210 (formed, e.g., of NiCr), an SAF region 214, a first transition region 220, a second transition region 221, a reference region 240, an intermediate region 230, and a storage region 250 (which also is referred herein as a "free" region). First transition region 220 may include the non-ferromagnetic transition metal tantalum (Ta). In some aspects, first transition region 220 may be pure tantalum (100% tantalum) or substantially pure tantalum (about 100% tantalum). Second transition region 221 may include an alloy including iron and boron, e.g., an iron-boron alloy (FeB). In some aspects, the concentration of boron (B) in transition region 221 may be greater than or equal to 50 atomic percent (at. %), and iron (Fe may make up the remainder of the iron boron alloy. For example, the concentration of boron (B) in transition region 221 may be greater than or equal to 60 at. % or greater than or equal to 70 at. %. The concentration of boron (B) in the iron boron alloy (FeB) of transition region 221 may yield a weakly magnetic or non-ferromagnetic transition region 221. One exemplary embodiment of MTJ bit 200 may include a first tantalum transition region 220 having a thickness of approximately 2 Å to approximately 3.5 Å and a second $Fe_{50}B_{50}$ (i.e., an iron-boron alloy having about 50 atomic percent boron) transition region 221 having a thickness of approximately 6 Å to approximately 8 Å.

Although FIG. 4 depicts the tantalum transition region as being below the iron boron alloy transition region, it is contemplated that the positions of the two transition regions may be swapped, so that the iron boron transition region is adjacent SAF region 214, and the tantalum transition region is adjacent reference region 240. Additionally, in some aspects, the entire magnetoresistive stack may be flipped such that while the tantalum transition region is adjacent SAF region 214 and the iron boron transition region is adjacent reference region 240, the tantalum transition region may be above the iron boron transition region.

The bilayer construction with a combination of an iron boron transition region with greater than or equal to 50 at. % boron and a tantalum transition region may facilitate and/or improve the growth and/or quality of overlying intermediate region 230 during fabrication of MTJ bit 200. As a result, use of a bilayer transition region may directly affect the ability to obtain improved breakdown distributions and hence to improved cycling endurance of MTJ bit 200. For example, the improved quality of intermediate region 230 resulting from the dual-transition region arrangement of FIG. 4 may in turn improve time-dependent dielectric breakdown and/or may improve the interfaces around intermediate region 230. This may in turn improve spin-torque switching efficiency by causing a reduction in the amount of voltage needed to switch the magnetic orientation of storage region 250 (a free region). Maintaining low switching currents may positively affect spin-transfer torque MRAM operation.

One possible mechanism for achieving improved tunnel barrier quality is that use of the Ta/FeB bilayer transition regions may prevent or decrease oxidation of the interface between intermediate region 230 and reference region 240 (e.g., an MgO tunnel barrier 230 and a CoFeB reference region 240). The improved quality of intermediate region 230 may in turn lower the switching voltage, and hence the operation voltage, compared with conventional MTJ stacks with single transition layers. Because switching voltage and thus operation voltage may be reduced, time to failure of time-dependent dielectric breakdown may become longer, which may improve endurance performance of an MRAM chip. Additionally, power consumption during MRAM operation may be reduced.

FIGS. 5A and 5B graphically depict some of the advantages of using bilayer transition regions according to exemplary embodiments of the present disclosure compared to the conventional single transition layer. FIG. 5A depicts the effect of a bilayer transition region on switching voltage (Vc). On the left-hand side of the graph, the switching voltage of a conventional MTJ stack having a single transition region (top line) is compared to the switching voltages of a number of different MTJ stacks having various bilayer transition regions when switching from antiparallel to parallel. The right-hand side of the graph compares the same stacks when switching from parallel to antiparallel. As can be seen, when switching antiparallel to parallel or parallel to antiparallel, the MTJ stacks with bilayer transition regions according to the present disclosure have a lower switching voltage compared to conventional MTJ stacks having a single transition region.

FIG. 5B depicts the effect of bilayer transition regions on the operation voltage (Vop). Operation voltage in FIG. 5B is calculated as follows: $Vop=Vc+4.5\sigma(Vc)$. On the left-hand side of the graph, the operation voltage of a conventional MTJ stack having a single transition region (top line) is compared to the operation voltages of a number of different MTJ stacks having various bilayer transition regions when switching from antiparallel to parallel. The right-hand side of the graph compares the same stacks when switching from parallel to antiparallel. As can be seen, when switching antiparallel to parallel or parallel to antiparallel, the MTJ stacks with bilayer transition regions according to the present disclosure have a lower operation voltage compared to conventional MTJ stacks.

To facilitate comparison, both of the switching voltage and the operation voltage measurements were normalized to RA=10, wherein RA is resistance×area. The x-axes of FIGS. 5A and 5B show the electrical diameter of the MTJ stacks in nanometers. The exemplary bilayer transition region MTJ stacks compared in FIGS. 5A and 5B include the following: (i) a first tantalum transition region of 2 Å thick, a second FeB transition region of 6 Å thick, and a reference region of CoFe 25 of 4 Å thick, wherein 25 represents the concentration of iron in the CoFe alloy, the remainder being Co; (ii) a first tantalum transition region of 3.5 Å thick, a second FeB transition region of 6 Å thick, and a reference region of CoFe 25 of 4 Å thick, wherein 25 represents the concentration of iron in the CoFe alloy, the remainder being Co; (iii) a first tantalum transition region of 3.5 Å thick, a second FeB transition region of 6 Å thick, and a reference region of CoFe 50 of 4 Å thick, wherein 50 represents the concentration of iron in the CoFe alloy, the remainder being Co; and (iv) a first tantalum transition region of 3.5 Å thick, a second FeB transition region of 6 Å thick, and a reference region of CoFe 75 of 4 Å thick, wherein 75 represents the concentration of iron in the CoFe alloy, the remainder being Co. The conventional MTJ stack used as a comparison had only a tantalum transition region of 3.5 Å thick and a reference region of $CoFe_{60}B_{20}$ of 8.6 Å thick.

As alluded to above, the MTJ devices of the current disclosure may be implemented in a sensor architecture or a memory architecture (among other architectures). For example, in a memory configuration, the above-described MTJ cells with multiple stacked MTJ bits may be electrically connected to an access transistor and configured to couple or connect to various conductors, which may carry one or more control signals, as shown in FIG. 6. The MTJ devices of the current disclosure may be used in any suitable application, including, e.g., in a memory configuration. In such instances, the described MTJ devices may be formed as an integrated circuit comprising a discrete memory device (e.g., as shown in FIG. 7A) or an embedded memory device having a logic therein (e.g., as shown in FIG. 7B), each including MRAM, which, in one embodiment is representative of one or more arrays of MRAM having a plurality of MTJ cells, according to certain aspects of certain embodiments disclosed herein.

For example, embodiments of the present disclosure may be used in spin-transfer torque magnetoresistive random access memory (STT-MRAM) devices, including stand-alone STT-MRAM and embedded STT-MRAM devices. Embodiments of the disclosure may provide improved endurance performance in STT-MRAM, which may allow for replacement of dynamic random-access memory (DRAM) and static random-access memory (SRAM) with STT-MRAM.

It should be emphasized that the compositions and thicknesses of the regions described herein are as-deposited values. In some embodiments, these described values are those that are seen immediately after deposition. In some embodiments, the described thicknesses and compositions are the target thicknesses and the composition of the sputter targets used in the deposition of the various regions. As known to those of ordinary skill in the art, experimental variations in these thicknesses and compositions can be expected. Further, as known to those of ordinary skill in the art, over time and/or exposure to high temperatures (such as, for example, during annealing, etc.), the materials of the various regions may alloy with each other to form a more homogenous structure without distinct interfaces demarcating the different regions. As a result of such alloying, over time, regions that were formed by depositing one material may include some amount of another material from a neighboring region.

Exemplary methods of fabricating selected embodiments of the disclosed magnetoresistive stack 200 (e.g., magnetoresistive stack 200 of FIG. 4) will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 8 depicts a flow chart of an exemplary method of fabricating magnetoresistive stack 200 according to the present disclosure. In the discussion below, reference will be made to FIGS. 1, 2, and 4. A first electrode (e.g., bottom electrode 10) may be first formed on the backend (surface with circuitry) of a semiconductor substrate by any suitable process (step 300). A seed region 210 may be formed on first electrode 10 (step 310). A "fixed" region 20 then may be formed on or above seed region 210 (step 305). In some embodiments, "fixed" region 20 may be formed by providing (e.g., sequentially) different regions that comprise the "fixed" region 20, including SAF region 214 (step 311), first transition region 220 made up of tantalum (step 312), second transition region 221 made up of an iron boron alloy having a concentration of boron greater than or equal to 50 at. % (step 313), and reference region 240 (step 314). Forming SAF region 214 may include forming at least two magnetic regions 14, 18 separated by a coupling region 16. An intermediate region 30 including tunnel barrier 230 then may be formed on or above an exposed surface of "fixed" region 20 (step 315). A "free" region 50 including storage region 250 may be formed on or above the exposed surface of tunnel barrier 230 of intermediate region 30 (step 316). A dielectric material may then be provided on the exposed surface of the "free" region 50 and tunnel barrier 230 to form one or more of a second intermediate region with a tunnel barrier 230, a spacer region, a capping region, and/or a second electrode (step 317). It should be noted that, in some embodiments, some of the above described steps (or regions) may be eliminated or may be duplicated or added to in order to form other embodiments of magnetoresistive stacks.

Any suitable method may be used to form the different regions of the magnetoresistive stacks 100/200. Since suitable integrated circuit fabrication techniques (e.g., deposition, sputtering, evaporation, plating, etc.) that may be used to form the different regions are known to those of ordinary skill in the art, they are not described here in great detail. In some embodiments, forming some of the regions may involve thin-film deposition processes, including, but not limited to, physical vapor deposition techniques such as ion beam sputtering and magnetron sputtering. And, forming thin insulating layers may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment.

In some embodiments, formation of some or all of the regions of magnetoresistive stack 100 may also involve known processing steps such as, for example, selective deposition, photolithography processing, etching, etc., in accordance with any of the various conventional techniques known in the semiconductor industry. In some embodiments, during deposition of the disclosed "fixed" and "free" regions, a magnetic field may be provided to set a preferred easy magnetic axis of the region (e.g., via induced anisotropy). Similarly, a strong magnetic field applied during the post-deposition high-temperature anneal step may be used to induce a preferred easy axis and a preferred pinning direction for any antiferromagnetically pinned materials.

In some embodiments, a magnetoresistive device is disclosed. The magnetoresistive device may include a tunnel barrier region, a magnetically fixed region positioned on one side of the tunnel barrier region, a magnetically free region positioned on an opposite side of the tunnel barrier region, and one or more transition regions positioned between the magnetically fixed region and the tunnel barrier region. The one or more transition regions may include at least a first transition region and second transition region. The first transition region may include a non-ferromagnetic transition metal and the second transition region may include an alloy including iron and boron.

Various embodiments of the disclosed magnetoresistive device may alternatively or additionally include one or more of the following aspects: the first transition region may include at least one of tantalum, titanium, tungsten, ruthenium, niobium, zirconium, or molybdenum; the first transition region may include tantalum; the first transition region may include substantially pure tantalum; the second transition region may include an iron-boron alloy (FeB); the second transition region may include an iron-boron alloy (FeB) having a concentration of boron greater than or equal to 50 atomic percent; the second transition region may include an iron-boron alloy (FeB) having a concentration of boron greater than or equal to 60 atomic percent; a thickness of the first transition region may be approximately 2 Å to approximately 3.5 Å, and the thickness of the second transition region may be approximately 6 Å to approximately 8 Å; the first transition region may include tantalum, and the second transition region may include an iron-boron alloy having about 50 atomic percent of boron ($Fe_{50}B_{50}$); the second transition region may be positioned between the first transition region and the tunnel barrier region; the first transition region may be positioned between the second transition region and the tunnel barrier region; the magnetoresistive device may further include a reference region positioned between the one or more transition regions and the tunnel barrier region, the reference region may include an alloy of iron, cobalt, and one or both of boron and tantalum, and one of the first transition region or the second transition region of the one or more transition regions may make an interface with the magnetically fixed region; and the magnetically fixed region may include a synthetic antiferromagnetic (SAF) structure.

In some embodiments, a magnetoresistive device is disclosed. The magnetoresistive device may comprise a tunnel barrier region, a magnetically fixed region including a synthetic antiferromagnetic (SAF) structure positioned on one side of the tunnel barrier region, a magnetically free region positioned on an opposite side of the tunnel barrier region, and one or more transition regions positioned between the magnetically fixed region and the tunnel barrier region. The one or more transition regions may include at least a first transition region including tantalum and a second transition region including an iron-boron alloy (FeB) having a concentration of boron greater than or equal to 50 atomic percent.

Various embodiments of the disclosed magnetoresistive device may alternatively or additionally include one or more of the following aspects: the first transition region may include substantially pure tantalum and the second transition region includes an iron-boron alloy having about 50 atomic percent of boron ($Fe_{50}B_{50}$); the second transition region may include an iron-boron alloy (FeB) having a concentration of boron greater than or equal to 60 atomic percent; a thickness of the first transition region may be approximately 2 Å to approximately 3.5 Å, and the thickness of the second transition region may be approximately 6 Å to approximately 8 Å; the second transition region may be positioned between the first transition region and the tunnel barrier region; the first transition region may be positioned between the second transition region and the tunnel barrier region; and the magnetoresistive device may further include a reference region positioned between the one or more transition regions and the tunnel barrier region, and the reference region may include an alloy of iron, cobalt, and one or both of boron and tantalum, one of the first transition region or the second transition region of the one or more transition regions may make an interface with the magnetically fixed region, and the reference region may make an interface with the tunnel barrier region.

Although various embodiments of the present disclosure have been illustrated and described in detail, it will be readily apparent to those skilled in the art that various modifications may be made without departing from the present disclosure or from the scope of the appended claims.

What is claimed is:

1. A magnetoresistive device, comprising:
a tunnel barrier region;
a magnetically fixed region positioned on one side of the tunnel barrier region, wherein the magnetically fixed region includes a synthetic antiferromagnetic (SAF) structure;
a magnetically free region positioned on an opposite side of the tunnel barrier region;
one or more transition regions positioned between the magnetically fixed region and the tunnel barrier region, wherein the one or more transition regions include at least a first transition region and second transition region, wherein the first transition region includes a non-ferromagnetic transition metal and the second transition region includes an alloy including iron and boron, and wherein the first transition region is positioned between the second transition region and the tunnel barrier region; and
a reference region positioned between the one or more transition regions and the B tunnel barrier region and making an interface with the tunnel barrier region,
wherein the first transition region is positioned between the reference region and the second transition region.

2. The magnetoresistive device of claim 1, wherein the first transition region includes at least one of tantalum, titanium, tungsten, ruthenium, niobium, zirconium, or molybdenum.

3. The magnetoresistive device of claim 1, wherein the first transition region includes tantalum.

4. The magnetoresistive device of claim 1, wherein the first transition region includes substantially pure tantalum.

5. The magnetoresistive device of claim 1, wherein the alloy including iron and boron in the second transition region includes a concentration of boron greater than or equal to 50 atomic percent.

6. The magnetoresistive device of claim 1, wherein the alloy including iron and boron in the second transition region includes a concentration of boron greater than or equal to 60 atomic percent.

7. The magnetoresistive device of claim 1, wherein a thickness of the first transition region is approximately 2 Å to approximately 3.5 Å, and the thickness of the second transition region is approximately 6 Å to approximately 8 Å.

8. The magnetoresistive device of claim 7, wherein the first transition region includes tantalum, and the alloy including iron and boron in the second transition region includes about 50 atomic percent of boron ($Fe_{50}B_{50}$).

9. The magnetoresistive device of claim 1, wherein the reference region includes an alloy of iron, cobalt, and one or both of boron and tantalum, and
wherein the second transition region of the one or more transition regions makes an interface with the magnetically fixed region.

10. A magnetoresistive device, comprising:
a tunnel barrier region;
a magnetically fixed region positioned on one side of the tunnel barrier region, the magnetically fixed region including a synthetic antiferromagnetic (SAF) structure;
a magnetically free region positioned on an opposite side of the tunnel barrier region; and
one or more transition regions positioned between the magnetically fixed region and the tunnel barrier region, wherein the one or more transition regions includes at least
a first transition region including tantalum, and
a second transition region including an iron-boron alloy (FeB) having a concentration of boron greater than or equal to 50 atomic percent,
wherein the first transition region is positioned between the second transition region and the tunnel barrier region.

11. The magnetoresistive device of claim 10, wherein the first transition region includes substantially pure tantalum and the second transition region includes an iron-boron alloy having about 50 atomic percent of boron ($Fe_{50}B_{50}$).

12. The magnetoresistive device of claim 10, wherein the second transition region includes an iron-boron alloy (FeB) having a concentration of boron greater than or equal to 60 atomic percent.

13. The magnetoresistive device of claim 10, wherein a thickness of the first transition region is approximately 2 Å to approximately 3.5 Å, and the thickness of the second transition region is approximately 6 Å to approximately 8 Å.

* * * * *